United States Patent [19]

Barnett

[11] 4,251,286
[45] Feb. 17, 1981

[54] THIN FILM PHOTOVOLTAIC CELLS HAVING BLOCKING LAYERS

[75] Inventor: Allen M. Barnett, Newark, Del.

[73] Assignee: The University of Delaware, Newark, Del.

[21] Appl. No.: 76,596

[22] Filed: Sep. 18, 1979

Related U.S. Application Data

[63] Continuation-in-part of Ser. No. 944,999, Sep. 22, 1978, abandoned.

[51] Int. Cl.³ .............................................. H01L 31/04
[52] U.S. Cl. .................................... 136/260; 136/255; 357/16; 357/30; 357/62; 427/74
[58] Field of Search .......... 136/89 TF, 89 CD, 89 SJ; 357/16, 30, 62; 427/74, 126

[56] References Cited

U.S. PATENT DOCUMENTS

| Re. 29,812 | 10/1978 | Jordan et al. | 136/89 TF |
| 4,086,101 | 4/1978 | Jordan et al. | 136/89 CD |
| 4,159,914 | 7/1979 | Jordan et al. | 136/89 TF |

OTHER PUBLICATIONS

Y. S. Tyan, "Preparation of Cadmium Sulfide Solar Cells," *Research Disclosure*, pp. 20-21, (1977).
A. Rothwarf et al., "Design Analysis of the Thin-Film CdS–Cu₂S Solar Cell," *IEEE Trans. Electron Devices*, vol. ED-24, pp. 381-387 (1977).

*Primary Examiner*—Aaron Weisstuch
*Attorney, Agent, or Firm*—Connolly and Hutz

[57] ABSTRACT

Electrical path failures in thin film photovoltaic cells are avoided by disposing at least one blocking layer in the cell to prevent undesired electrical contact which might otherwise occur between the transparent and opaque electrical contacts as well as between one of the contacts and the semiconductor which is remote from it.

43 Claims, 6 Drawing Figures

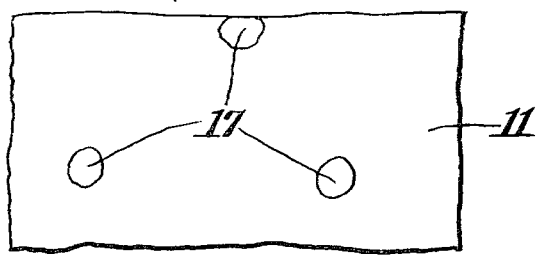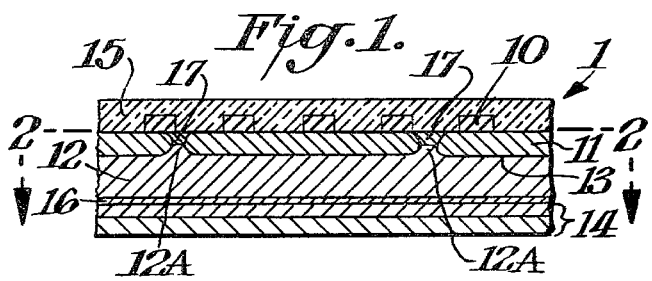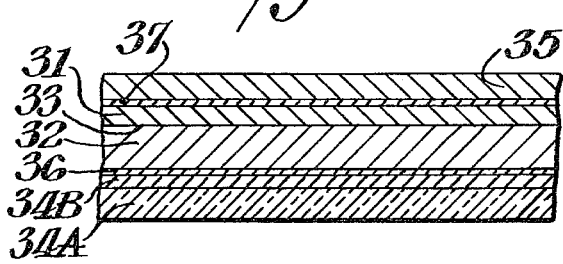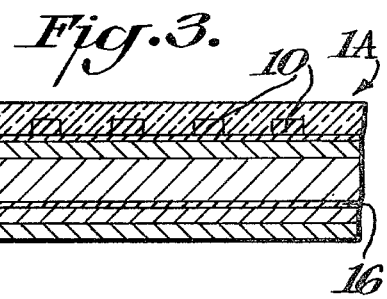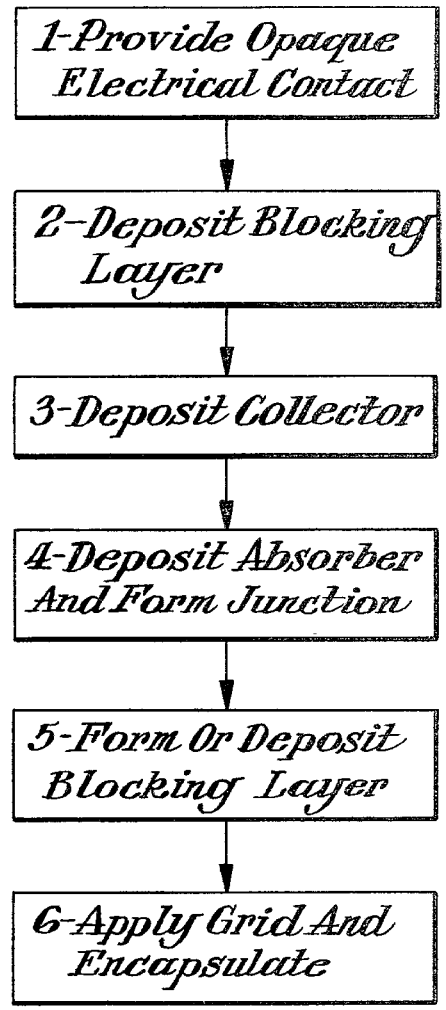

THIN FILM PHOTOVOLTAIC CELLS HAVING BLOCKING LAYERS

CROSS REFERENCE TO RELATED APPLICATION

This application is a continuation-in-part of Ser. No. 944,999 filed Sept. 22, 1978, abandoned.

BACKGROUND OF INVENTION

This invention relates to methods for making photovoltaic cells and, in particular, to methods for making large area thin film photovoltaic cells with higher yield and greater reliability.

A photovoltaic cell, often referred to as a solar cell, is a semiconductor junction device which converts light energy into electrical energy. A typical photovoltaic cell is a layered structure comprising five principal layers: (1) an absorber-generator, (2) a collector-converter, (3) a transparent electrical contact, (4) an opaque electrical contact and (5) an encapsulant. When light is shone through the transparent contact onto the absorber-generator, the device generates between the two contacts a voltage differential and a current.

The absorber-generator (commonly referred to as the "absorber") is a layer of semiconductor material which absorbs light photons and, as a consequence, generates minority carries. Typically, atoms of the absorber absorb photons and eject electrons thus creating pairs of negatively charged carriers (electrons) and positively charged carriers ("holes"). If the absorber is a p-type semiconductor, the electrons are minority carriers; if it is n-type, the holes are minority carriers. As minority carriers are readily annihilated in the absorber by recombination with the plentiful majority carriers, they must be transported to a region wherein they are majority carriers before they can be utilized to provide power for an electrical circuit.

The collector-converter (the "collector") is a layer of material in electrical contact with the absorber wherein the majority carriers are of the same conductivity type as the minority carriers generated in the absorber. This layer "collects" minority carriers from the absorber and "converts" them into majority carriers. If the collector is an oppositely doped region of the same semiconductor as the absorber, the photovoltaic device is a p-n junction of homojunction device. If the collector is comprised of a different semiconductor, the device is a heterojunction; and, if the collector is metal, the device is a Schottky junction.

The transparent contact is a conductive electrical contact which permits light to pass through to the absorber. It is typically either a continuous transparent film of conductive material or an open grid of opaque conductive material. If the transparent contact is on the same side of the photovoltaic device as the absorber, the device is referred to as being in the front wall configuration. If the transparent contact is on the opposite side, the device is said to be in the back wall configuration.

Although scientists have known about the photovoltaic effect for more than a century, it is only within the past twenty-five years that it could be considered a practical means for generating electricity in useful amounts. Prior to 1950, photovoltaic devices were limited in use to highly specialized applications, such as light metering, wherein conversion efficiency was immaterial and electrical current demand was minimal.

The advent of silicon semiconductor technology in the 1950's permitted the development of high cost, high conversion efficiency silicon junction photovoltaic cells. Arrays of such devices have been used with considerable success in the space program where cost is of little significance. However, the cost of such devices as energy generators, typically from a low of $7,000 per kilowatt to as high as $100,000 per kikowatt, is prohibitively high for terrestrial applications wherein they must compete against conventional generators. While much of this cost is due to the high quality control standards required for spacecraft components, a substantial portion is due to the high cost of preparing silicon crystals of the required purity and due to the inefficiencies of the batch processes by which such cells are fabricated.

While thin film photovoltaic cells possess many potential advantages over silicon cells in terrestrial applications, the fabrication and use of thin film cells has historically been plagued with problems of low yield, non-reproducibility and unreliability. Thin film photovoltaic cells employing thin films of polycrystalline material, such as cadmium sulfide or cadmium zinc sulfide and copper sulfide, offer substantial advantages for the development of continuous processing techniques, and they are flexible and light of weight. Consequently, they offer much promise as solar cells which can be easily fabricated, transported and deployed over large areas. Unfortunately, thin film cells of good efficiency have been difficult to reproduce consistently, and the operating lifetime of the cells produced has been uncertain.

Accordingly, there is a need for a method for making thin film photovoltaic cells with greater yield, reproducibility and reliability.

SUMMARY OF INVENTION

The present invention is based on the recognition that a primary source of failure in thin film photovoltaic cells, both in manufacturing and in field deployment, is caused by the undesirable short circuits or shunt diode formation between materials which are not intended to be in electrical contact with one another. Specifically, applicant has recognized that in front wall configuration photovoltaic cells, three major failure mechanisms are unwanted short circuits (1) between the transparent and opaque contacts, (2) between the transparent contact and the collector-converter and (3) between the absorber-generator and the opaque contact. In back wall configuration cells, unwanted shorts develop (1) between the contacts, (2) between the transparent contact and the absorber-generator and (3) between the collector-converter and the opaque contact.

In accordance with the invention, in the fabrication of thin film photovoltaic devices, thin electrical blocking layers are formed between successive layers of the device in order to prevent undesired short circuits.

THE DRAWINGS

FIG. 1 is a schematic cross-sectional view of a front wall thin film photovoltaic cell in accordance with this invention wherein blocking layers are located on portions of the collector that are not covered by the absorber and between the collector and opaque electrical contact;

FIG. 2 is a cross-sectional view taken through FIG. 1 along the line 2—2;

FIG. 3 is a view similar to FIG. 1 of a further embodiment of this invention showing different locations for the blocking layers;

FIG. 4 is a cross-sectional view similar to FIG. 3 but showing the junction between the absorber and collector as of a hill and valley type construction;

FIG. 5 is a view similar to FIG. 3 but exemplifies one form of back wall cell; and FIG. 6 is a flow diagram indicating the steps for forming the cell of FIG. 1.

DETAILED DESCRIPTION

FIG. 1 illustrates a typical front wall thin film photovoltaic solar cell 1. In general, solar cell 1 comprises as successive components in the electrical path, a transparent electrical contact means 10 such as a gold, silver, nickel, copper or metal alloy grid electrode or conductive glass; an absorber-generator 11, such as a thin film of copper sulfide, disposed in electrical contact with grid electrical contact 10; a collector-converter 12, such as a film of cadmium sulfide or cadmium zinc sulfide, disposed in contact with the absorber and forming an electrical junction 13, therewith; and an opaque electrical contact 14, such as a layer of zinc plated copper foil or brass making electrical contact with the collector 12. In a typical thin film photovoltaic device, the copper sulfide absorber will have a thickness on the order of 1000 to 5000 angstroms; the cadmium sulfide or cadmium zinc sulfide collector will have a thickness of approximately 2 to 40 microns; and the zinc-plated copper foil contact will have a copper foil thickness of 15 to 30 microns and the zinc plate a thickness of about 0.1 to 1 micron. In addition, the grid-covered absorber surface of the device is conveniently encapsulated in transparent glass 15 to protect the exposed surface from oxidation, contaminants and physical damage. Since opaque contact 14 comprises a substrate for the remaining components, it is referred to as a first electrical contact and electrical contact 10 is referred to as a second electrical contact. Similarly, for the sake of simplicity, the absorber and collector may also be referred to simply as "semiconductors".

Applicant has recognized that in such thin film cells flaws occur such as physical, metallurgical and electrical inhomogeneities. These flaws may be, for example, voids, discontinuities or such inhomogeneities as changes in the concentration of carriers, impurities, dopants, constituent elements and traps. FIG. 2, for example, indicates typical discontinuities which would result in the absorber layer whereby undesired electrical contact would otherwise result between the transparent contact 10 and the collector 12 but which is avoided by the present invention. It is to be understood that the present invention is concerned with such electrical path failures, as opposed to optical path failures, which may be opens, shorts, shunts or series resistances. In general, the invention comprises avoiding such undesired electrical contacts by locating a blocking layer between the components which should not electrically contact each other.

The blocking layers may take various forms. For example, a semiconductor material such as zinc sulfide may be deposited in the electrical path. It is also possible in the practice of the invention to utilize an insulating layer which includes materials having resistivity in the insulative range. Since the insulating layer would likewise be extremely thin, discontinuities would also result in the layer so that there is proper electrical contact between adjacent components of the cell in the areas of blocking layer discontinuities. These discontinuities in the insulative blocking area may also be deliberately introduced by varying the means of application. The likelihood of a blocking layer discontinuity overlapping or being aligned with a semiconductor (i.e. collector or absorber) discontinuity is so highly improbable that it should, for all intents and purposes, be discounted. Thus, the application of the blocking layer, even with its own discontinuities, will effectively function to carry out the objects of this invention.

The invention may further be practiced by having the blocking layer result from the reaction of the exposed areas of the semiconductor, i.e. where one semiconductor is exposed through the discontinuities of the other semiconductor. In this respect, for example, the exposed portions of the semiconductor may be reacted with a specific ambient such as by heating in air to result in the formation of the blocking layer only in those areas of discontinuity.

The type of a specific blocking layer material can accordingly widely vary. Thus as indicated above, the blocking layer can comprise a thin layer of semiconductor material having an electron affinity which will lead to the formation of a heterojunction or Schottky barrier junction which will not pass significant quantities of current at the normal operating voltage of the solar cell but which will make an ohmic contact with the successive component. Such a layer prevents unwanted shorts by parallel semiconductor junction tailoring. Alternatively, the blocking layer can be a material which forms a rectifying contact with the non-successive layer. Further, the blocking layer can be a layer of insulating material selectively formed to insulate in regions of probable shorting.

In the specific embodiment of FIGS. 1-2, blocking layer 16 is formed to prevent undesired electrical contact between transparent contact 10 and opaque contact 14 and between absorber 11 and opaque contact 14, while blocking layer 17 is formed to prevent undesired electrical contact between the transparent contact 10 and collector 12. Specifically, by locating blocking layer 16 in the electrical path between collector 12 and opaque contact 14, shorts are prevented between the two electrical contacts 10, 14 and between absorber 11 and opaque contact 14. Additionally, by locating blocking layer 17 in the areas of discontinuity of absorber 11, shorts are prevented between transparent contact 10 and collector 12.

FIG. 3 illustrates an alternative arrangement for the location of the blocking layers wherein layer 19 is located above absorber 11 and below transparent contact 10 in the cell 1A.

The front wall cells illustrated in FIGS. 1 and 3 schematically show the various layers to be planar. This planar structure may be achieved through the natural deposition process or by chemically polishing the components. It is possible, however, to form the junction non-planar or irregular between the collector and absorber with hills and valleys whereby instead of chemically polishing, a conventional pre-etching technique is used to result in a texturing effect such as illustrated in FIG. 4. It is noted that, for the sake of simplicity, FIG. 4 shows the irregularities in exaggerated geometrically smooth hills and valleys. It is to be understood that the concepts of this invention may be practiced with both planar and textured structures. Thus, for example, FIG. 4 illustrates blocking layer 20 to be located at the junction between absorber 11 and transparent contact 10 in the cell 1B.

FIG. 5 also illustrates the application of the invention to back wall cells. In this respect, back wall cell 1C includes, for example, a glass substrate 34A having a conductive layer 34B such as tin oxide thereon to comprise transparent contact 34. The back wall cell 1C also includes collector 32 which may be, for example, cadmium sulfide or cadmium zinc sulfide forming a junction 33 with absorber 31 which may be copper sulfide and finally opaque contact 35 which may be copper. Blocking layers 36 and 37 are provided in the same manner as with the front wall cells.

FIG. 6 illustrates a flow diagram for forming cell 1 of FIGS. 1-2. In essence, the method of fabricating photovoltaic cell 1 involves the steps of providing a first electrical contact 14, depositing a collector-converter 12 on the first contact, depositing an absorber-generator 11 on the collector-converter 12 to form junction 13 therebetween, and applying a second electrical contact 10 and encapsulation means 15 to the absorber-generator. In accordance with the invention, this method further comprises the steps of providing between the electrical contacts blocking layers 16 and 17 of material for preventing undesired short circuits between non-successive layers without substantially interfering with the electrical flow between successive layers.

As illustrated in FIG. 6, the first step involves providing an opaque electrical contact 14 which is conveniently used as a substrate during the remainder of the process. In the fabrication of the device of FIG. 1, this step is preferably effectuated by (a) providing copper foil, (b) cleaning the foil surfaces electrolytically and by immersion in sulphuric acid, and (c) depositing a thin layer of zinc on the cleaned surface by electroplating.

The next step involves forming blocking layer 16 which is preferably a layer of zinc sulfide. Such a layer is formed by depositing a 0.1 to 2 micron average thickness layer of zinc sulfide by vacuum evaporation, sputtering or by chemical deposition.

Blocking layer 16 may alternatively be oxides or nitrides. As previously indicated, where an insulating blocking layer material is used, because the layer is so thin, discontinuities would form or would be deliberately formed in the blocking layer itself so as to permit the desired electrical contact between opaque contact 14 and collector 12.

The next step involves depositing a collector-converter. In fabricating the device of FIG. 1, this step is preferably effected by evaporation, sputtering or chemical deposition of a cadmium sulfide or cadmium zinc sulfide collector. The collector surface can also be textured as by etching in hydrochloric acid, to promote efficient light collection. A four second dip in 55% v/v concentration HCl at 60° C. has been found satisfactory.

The next step involves depositing an absorber-generator on the collector and forming a junction 13 between the absorber and the collector. In the fabrication of the FIG. 1 device, this step is preferably effectuated by growing $Cu_2S$ on the CdS by an ion exchange process using an aqueous solution of cuprous chloride. A ten second dip has been found satisfactory in the following bath composition from which oxygen has been excluded:

| Component | Quantity |
| --- | --- |
| Deionized water | 4 liters |
| CuCl | 24 grams |
| NaCl | 8 grams |
| HCl | Sufficient to produce pH of 2-3 |
| Temperature | 98-100° C. |

Alternately, the cuprous chloride can be vapor deposited.

The resulting structure is then heat treated in a reducing atmosphere to form an acceptable junction 13 between the cadmium sulfide and the copper sulfide. During the heat treatment, copper sulfide diffuses into the cadmium sulfide and "dopes" it in the interfacial region. In addition, the reducing atmosphere chemically reduces oxides, such as $Cu_2O$, that form on the free surface of the $Cu_2S$. A fifteen-hour heat treatment in a 90% argon-10% hydrogen atmosphere at 170° C. has been found satisfactory. Alternatively, heat treatment at higher temperatures and shorter times is also satisfactory.

As illustrated in FIGS. 1-2, applicant has recognized that discontinuities occur in absorber 11. Such discontinuities may be considered as holes or open spaces in the copper sulfide or other absorber material whereby in these open spaces the cadmium sulfide collector is exposed. Such discontinuities might also extend through the collector whereby, for example, portions of the zinc sulfide blocking layer could be exposed. FIG. 1 shows the discontinuities in absorber 11 in exaggerated form to facilitate a better understanding of the practice of the invention. In the embodiment of FIG. 1, the device is heated in the presence of a specific liquid or gaseous (such as air) ambient so that a reaction occurs at the exposed portions 12A of collector 12 to result in blocking layer 17 being formed at the spaced areas in which discontinuities of absorber 11 occur. In the embodiment illustrated in FIGS. 1-2, blocking layer 17 is formed of cadmium sulfate on the exposed portions of cadmium sulfide by heating the structure in an oxygen containing atmosphere such as air as the ambient at a temperature of 200° C. for two minutes. Alternatively, a blocking layer could be applied over the whole absorber surface including the areas of discontinuity. One example of this alternative would be the deposition of copper oxide by evaporation or sputtering deposition of copper and the formation of copper oxide by oxidation.

The transparent contact 10 is then formed and is preferably a conductive glass or a grid applied by printing or vacuum evaporation through a suitable mask (or a conductive glass) and glass may be used as encapsulant 15.

It is to be understood that the description indicated above regarding the specific formation of cell 1 is intended merely to be exemplary. Reference is also made to co-pending application Ser. No. 43,315 filed May 29, 1979 which describes a continuous process for manufacturing a thin film cell and wherein the techniques described therein may be utilized for the practice of this invention. Accordingly, the details therein are incorporated herein by reference thereto. Similarly, the details of application Ser. No. 944,999 filed Sept. 22, 1978 are also incorporated herein by reference thereto.

The cells illustrated in FIGS. 3-5 include blocking layers formed by depositing the desired material at the locations indicated therein in a manner similar to the formation of blocking layer 16 of FIG. 1. In this respect, blocking layers 19 (FIG. 3), 20 (FIG. 4) and 36 and 37 (FIG. 5) would comprise an entire layer except for the discontinuities that would result from this application similar to layer 16 in contrast to simply forming a layer at isolated locations such as layer 17. The upper blocking layer may be an oxide (such as copper oxide), a sulfate or other insulating materials and thus is not necessarily limited to cadmium sulfate.

As emphasized above, the blocking layer may be selected from a wide range of materials. It is preferred that the specific material, however, be "chemically compatible" with at least one of the semiconductors (absorber and collector). The term "chemically compatible" is used in this application to mean a material which results from the reaction of a specific ambient with exposed positions of the otherwise remote semiconductor and is also used to mean a blocking layer material (such as zinc sulfide) having a chemical component in common with at least one semiconductor (such as cadmium sulfide collector 12).

It is to be understood that throughout this specification and the appended claims that a layer comprising cadmium sulfide embraces not only a layer of pure cadmium sulfide but also related materials containing cadmium sulfide wherein the characteristics of the cadmium sulfide predominate such as a layer of cadmium sulfide including a minor proportion of another metal, such as zinc, in an alloy such as cadmium zinc sulfide including 10 to 30 percent of zinc in place of cadmium. Similarly, reference to layers comprising zinc sulfide embrace zinc cadmium sulfide with a minor proportion of cadmium. In addition, it should be noted that, in the context of this application, materials which are technically classifiable as semiconductors may nonetheless be sufficiently restrictive of current that they can, and do, effectively operate as insulators. In addition, the term layer as used herein encompasses not only a continuous layer, but, in addition, a discontinuous layer selectively formed where needed at a plurality of spots.

While the invention has been described in connection with but a small number of specific embodiments, it is to be understood that these are merely illustrative of many other specific embodiments which can also utilize the principles of the invention. Thus numerous and varied devices can be made by those skilled in the art without departing from the spirit and scope of the present invention.

What is claimed is:

1. In a method for fabricating a thin film photovoltaic device having as its components a transparent electrical contact and an opaque electrical contact with an intermediate pair of semiconductors being located between said electrical contacts and said intermediate pair of semiconductors forming a photovoltaic junction therebetween and functioning as a collector-converter and as an absorber-generator, respectively, the improvement being forming an electrical blocking layer in the electrical path between said transparent and said opaque electrical contacts to prevent undesired electrical contact between components of said device separated from each other by said blocking layer, one of said semiconductors having discontinuities through which the other of said semiconductors is exposed, said blocking layer being located to prevent said other semiconductor from making undesired electrical contact through said discontinuities of said one semiconductor, and said blocking layer being formed only in the exposed areas of said other semiconductor.

2. The method of claim 1 wherein said blocking layer is formed by reacting said exposed areas of said other semiconductor with a liquid or gas ambient.

3. The method of claim 2 wherein said other semiconductor is made of cadmium sulfide and said blocking layer is cadmium sulfate.

4. In a method for fabricating a thin film photovoltaic device having as its components a transparent electrical contact and an opaque electrical contact with an intermediate pair of semiconductors being located between said electrical contacts and said intermediate pair of semiconductors forming a photovoltaic junction therebetween and functioning as a collector-converter and as an absorber-generator, respectively, the improvement being forming an electrical blocking layer in the electrical path between said transparent and said opaque electrical contacts to prevent undesired electrical contact between components of said device separated from each other by said blocking layer, and said blocking layer being an insulating material having discontinuities therein.

5. In a method for fabricating a thin film photovoltaic device having as its components a transparent electrical contact and an opaque electrical contact with an intermediate pair of semiconductors being located between said electrical contacts and said intermediate pair of semiconductors forming a photovoltaic junction therebetween and functioning as a collector-converter and as an absorber-generator, respectively, the improvement being forming an electrical blocking layer in the electrical path between said transparent and said opaque electrical contacts to prevent undesired electrical contact between components of said device separated from each other by said blocking layer, disposing said blocking layer adjacent said collector-converter and remote from said absorber-generator, and forming said blocking layer with discontinuities therein.

6. In the method of claim 5 wherein said blocking layer is formed of a layer of zinc sulfide.

7. The method of claim 5 wherein said blocking layer is a semiconductor.

8. The method of claim 5 wherein said blocking layer is located adjacent to said opaque electrical contact.

9. The method of claim 8 wherein said device is a front wall cell and said transparent electrical contact is in the form of a conductive glass having a transparent encapsulant layer thereover.

10. The method of claim 8 wherein said device is a front wall cell and said transparent electrical contact is in the form of a metallic grid having a transparent encapsulation layer thereover.

11. The method of claim 5 wherein said blocking layer is located adjacent to said transparent electrical contact.

12. The method of claim 11 wherein said device is a back wall cell.

13. The method of claim 5 wherein said junction between said semiconductors is non-planar in the form of hills and valleys.

14. The method of claim 5 wherein said blocking layer is a material which is chemically compatible with at least one of said semiconductors.

15. The method of claim 14 wherein said blocking layer is chemically compatible by being a material having a chemical component in common with at least one of said semiconductors.

16. The method of claim 15 wherein said absorber-generator is made from copper sulfide, said collector-converter being made from cadmium sulfide, and said blocking layer being made from zinc sulfide.

17. In a method for fabricating a thin film photovoltaic device having as its components a transparent electrical contact and an opaque electrical contact with an intermediate pair of semiconductors being located between said electrical contacts and said intermediate pair of semiconductors forming a photovoltaic junction therebetween and functioning as a collector-converter and as an absorber-generator, respectively, the improvement being forming an electrical blocking layer in the electrical path between said transparent and said opaque electrical contacts to prevent undesired electrical contact between components of said device separated from each other by said blocking layer, said blocking layer being a material which is chemically compatible with at least one of said semiconductors by being a material having a chemical component in common with at least one of said semiconductors, said absorber-generator being made from copper sulfide, said collector-converter being made from cadmium sulfide, said blocking layer being made from zinc sulfide, and a further blocking layer being provided which is made from cadmium sulfate having discontinuities.

18. The method of claim 17 wherein said copper sulfide absorber-generator has discontinuities therein which cause portions of said cadmium sulfide collector-converter to be exposed, and said cadmium sulfate blocking layer being formed only at said exposed portions of said cadmium sulfide collector-converter.

19. In a method for fabricating a thin film photovoltaic device having as its components a transparent electrical contact and an opaque electrical contact with an intermediate pair of semiconductors being located between said electrical contacts and said intermediate pair of semiconductors forming a photovoltaic junction therebetween and functioning as a collector-converter and as an absorber-generator, respectively, the improvement being forming an electrical blocking layer in the electrical path between said transparent and said opaque electrical contacts to prevent undesired electrical contact between components of said device separated from each other by said blocking layer, and said blocking layer being formed from copper oxide and being located between said absorber-generator and said transparent electrical contact.

20. In a thin film photovoltaic device having as its components a transparent electrical contact and an opaque electrical contact with an intermediate pair of semiconductors being located between said electrical contacts and said intermediate pair of semiconductors forming a photovoltaic junction therebetween and functioning as a collector-converter and as an absorber-generator, respectively, the improvement being a blocking layer disposed in the electrical path between said transparent and said opaque electrical contacts to prevent undesired electrical contact between components of said device separated from each other by said blocking layer, one of said semiconductors having discontinuities through which the other of said semiconductors is exposed, said blocking layer being located to prevent said other semiconductor from making undesired electrical contact through said discontinuities of said one semiconductor, and said blocking layer being located only in the exposed areas of said other semiconductor.

21. The device of claim 20 wherein said other semiconductor is made of cadmium sulfide or cadmium zinc sulfide and said blocking layer is cadmium sulfate.

22. In a thin film photovoltaic device having as its components a transparent electrical contact and an opaque electrical contact with an intermediate pair of semiconductors being located between said electrical contacts and said intermediate pair of semiconductors forming a photovoltaic junction therebetween and functioning as a collector-converter and as an absorber-generator, respectively, the improvement being a blocking layer disposed in the electrical path between said transparent and said opaque electrical contacts to prevent undesired electrical contact between components of said device separated from each other by said blocking layer, and said blocking layer being an insulating material having discontinuities therein.

23. In a thin film photovoltaic device having as its components a transparent electrical contact and an opaque electrical contact with an intermediate pair of semiconductors being located between said electrical contacts and said intermediate pair of semiconductors forming a photovoltaic junction therebetween and functioning as a collector-converter and as an absorber-generator, respectively, the improvement being a blocking layer disposed in the electrical path between said transparent and said opaque electrical contacts to prevent undesired electrical contact between components of said device separated from each other by said blocking layer, said blocking layer being disposed adjacent said collector-converter and being remote from said absorber-generator, and said blocking layer having discontinuities therein.

24. The device of claim 23 wherein said blocking layer is a layer of zinc sulfide.

25. The device of claim 23 wherein said blocking layer is a semiconductor material.

26. The device of claim 23 wherein said blocking layer is located adjacent to said opaque electrical contact.

27. The device of claim 26 wherein said device is a front wall cell and said transparent electrical contact is in the form of a conductive glass having a transparent encapsulation layer thereover.

28. The device of claim 26 wherein said device is a front wall cell and said transparent electrical contact is in the form of a metallic grid having a transparent encapsulation layer thereover.

29. The device of claim 23 wherein said blocking layer is located adjacent to said transparent electrical contact.

30. The device of claim 29 wherein said device is a back wall cell.

31. The device of claim 23 wherein said junction between said semiconductors is non-planar in the form of hills and valleys.

32. The device of claim 23 wherein said blocking layer is a material which is chemically compatible with at least one of said semiconductors.

33. The device of claim 32 wherein said blocking layer is chemically compatible by being a material having a chemical component in common with at least one of said semiconductors.

34. The device of claim 33 wherein said absorber-generator is made from copper sulfide, said collector-converter being made from cadmium sulfide or cadmium zinc sulfide, and said blocking layer being made from zinc sulfide.

35. In a thin film photovoltaic device having as its components a transparent electrical contact and an opaque electrical contact with an intermediate pair of semiconductors being located between said electrical contacts and said intermediate pair of semiconductors forming a photovoltaic junction therebetween and functioning as a collector-converter and as an absorber-generator, respectively, the improvement being a blocking layer disposed in the electrical path between said transparent and said opaque electrical contacts to prevent undesired electrical contact between components of said device separated from each other by said blocking layer, said blocking layer being a material which is chemically compatible with at least one of said semiconductors by being a material having a chemical component in common with at least one of said semiconductors, said absorber-generator being made from copper sulfide, said collector-converter being made from cadmium sulfide or cadmium zinc sulfide, said blocking layer being made from zinc sulfide, and including a further blocking layer of cadmium sulfate having discontinuities.

36. The device of claim 35 wherein said copper sulfide absorber-generator has discontinuities therein which cause portions of said cadmium sulfide collector-converter to be exposed, and said cadmium sulfate blocking layer being formed only at said exposed portions of said cadmium sulfide collector-converter.

37. In a thin film photovoltaic device having as its components a transparent electrical contact and an opaque electrical contact with an intermediate pair of semiconductors being located between said electrical contacts and said intermediate pair of semiconductors forming a photovoltaic junction therebetween and functioning as a collector-converter and as an absorber-generator, respectively, the improvement being a blocking layer disposed in the electrical path between said transparent and said opaque electrical contacts to prevent undesired electrical contact between components of said device separated from each other by said blocking layer, and said blocking layer being formed from copper oxide and being located between said absorber-generator and said transparent electrical contact.

38. In a method for fabricating a thin film photovoltaic device having as its components a transparent electrical contact and an opaque electrical contact with an intermediate pair of semiconductors being located between said electrical contacts and said intermediate pair of semiconductors forming a photovoltaic junction therebetween and functioning as a collector-converter and as an absorber-generator, respectively, the improvement being forming a pair of spaced electrical blocking layers in the electrical path between said transparent and said opaque electrical contacts to prevent undesired electrical contact between different pairs of components of said device separated from each other by at least one of said blocking layers.

39. In the method of claim 38 wherein one of said blocking layers is located adjacent to said opaque electrical contact.

40. In the method of claim 39 wherein the other of said blocking layers is located adjacent to said transparent electrical contact.

41. In a thin film photovoltaic device having as its components a transparent electrical contact and an opaque electrical contact with an intermediate pair of semiconductors being located between said electrical contacts and said intermediate pair of semiconductors forming a photovoltaic junction therebetween and functioning as a collector-converter and as an absorber-generator, respectively, the improvement being a pair of spaced blocking layers disposed in the electrical path between said transparent and said opaque electrical contacts to prevent electrical contact between different pairs of components of said device separated from each other by at least one of said blocking layers.

42. The device of claim 41 wherein one of said blocking layers is located adjacent to said opaque electrical contact.

43. The device of claim 42 wherein the other of said blocking layers is located adjacent to said transparent electrical contact.

* * * * *